United States Patent
Park

(10) Patent No.: US 8,593,882 B2
(45) Date of Patent: Nov. 26, 2013

(54) SEMICONDUCTOR MEMORY DEVICE AND METHOD OF ERASING THE SAME

(75) Inventor: Young Soo Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 160 days.

(21) Appl. No.: 13/178,786

(22) Filed: Jul. 8, 2011

(65) Prior Publication Data

US 2012/0008396 A1  Jan. 12, 2012

(30) Foreign Application Priority Data

Jul. 9, 2010  (KR) .................. 10-2010-0066518

(51) Int. Cl.
G11C 16/04 (2006.01)
G11C 16/06 (2006.01)

(52) U.S. Cl.
USPC ............ 365/185.33; 365/185.22; 365/185.24; 365/185.28; 365/185.29

(58) Field of Classification Search
USPC .................................................. 365/185.33
See application file for complete search history.

(56) References Cited

U.S. PATENT DOCUMENTS

| | | | | |
|---|---|---|---|---|
| 6,504,765 B1 * | 1/2003 | Joo | .......................... | 365/185.29 |
| 6,842,378 B2 * | 1/2005 | Chang | ....................... | 365/185.22 |
| 7,230,853 B2 * | 6/2007 | Kwon et al. | ............. | 365/185.22 |
| 7,266,019 B2 * | 9/2007 | Taoka et al. | .............. | 365/185.29 |
| 7,499,335 B2 * | 3/2009 | Ho et al. | .................. | 365/185.28 |
| 7,633,813 B2 * | 12/2009 | Wang et al. | .............. | 365/185.29 |
| 7,668,019 B2 * | 2/2010 | Byeon | ....................... | 365/185.29 |
| 7,768,835 B2 * | 8/2010 | Goda | ........................ | 365/185.22 |
| 7,855,921 B2 * | 12/2010 | Jeon | ......................... | 365/185.29 |
| 8,023,330 B2 * | 9/2011 | Kim et al. | ................ | 365/185.19 |
| 2008/0144387 A1 * | 6/2008 | Kim et al. | ................ | 365/185.22 |
| 2009/0141551 A1 * | 6/2009 | Won et al. | ................. | 365/185.2 |
| 2009/0201728 A1 * | 8/2009 | Hwang et al. | ........... | 365/185.03 |

FOREIGN PATENT DOCUMENTS

| | | |
|---|---|---|
| KR | 1020080069498 | 7/2008 |
| KR | 1020090080321 | 7/2009 |
| KR | 1020010098374 | 11/2011 |

OTHER PUBLICATIONS

Notice of Preliminary Rejection issued from Korean Intellectual Property Office on Sep. 22, 2011.
Notice of Allowance issued by the Korean Intellectual Property Office on Mar. 27, 2012.

* cited by examiner

*Primary Examiner* — Son Mai
(74) *Attorney, Agent, or Firm* — IP & T Group LLP

(57) ABSTRACT

A semiconductor memory device includes memory cell blocks having physical pages coupled to memory cells, peripheral circuits configured to program the memory cells or read data stored in the memory cells, and a controller configured to control the peripheral circuits so that a pre-program is performed to make memory cells in the memory cell blocks have threshold voltages higher than a set voltage by programming memory cells of the selected memory cell block, having threshold voltages lower than the set voltage, in response to an erase command. The set voltage is an intermediate threshold voltage obtained from the threshold voltages of the memory cells of the selected memory cell block.

13 Claims, 6 Drawing Sheets

SEMICONDUCTOR MEMORY DEVICE AND METHOD OF ERASING THE SAME

CROSS-REFERENCE TO RELATED APPLICATION

Priority to Korean patent application number 10-2010-0066518 filed on Jul. 9, 2010, the entire disclosure of which is incorporated by reference herein, is claimed.

BACKGROUND

Exemplary embodiments relate to a semiconductor memory device and a method of erasing the same.

There is an increasing demand for semiconductor memory devices which can be electrically programmed and erased and can retain data even without the supply of power. In order to develop high-capacity memory devices capable of storing a large amount of data, technologies for the high integration of memory cells are being researched. To this end, there has been proposed a NAND type memory device including a plurality of memory blocks, each having a plurality of strings. Each of the strings have memory cells coupled thereto in series.

The semiconductor memory device performs an erase operation for erasing data on a memory-cell-block basis.

In the erase operation, the memory cells of the memory cell block have various threshold voltages. In particular, when the memory cells are multi-level cells (MLCs), the threshold voltages of the memory cells have 4, 8, or more threshold voltage distributions. Consequently, there is a great difference between a low threshold voltage and a high threshold voltage.

Accordingly, if the erase operation is performed on a memory-cell-block basis with memory cells having various threshold voltages, the threshold voltages of the memory cells are widely distributed at 0 V or less.

If the threshold voltages of the memory cells having the erase state (referred to as "erase cells") have a wide distribution width at 0V or less, threshold voltages of memory cells in a subsequent data program operation are also likely to have a wide distribution width. In order to prevent this occurrence, it is important that the threshold voltages of the erase cells having 0 V or less are made to have a narrow threshold voltage distribution close to 0 V.

To this end, a pre-program is performed on a memory cell block including MLCs before the erase operation is performed.

The pre-program is performed so that the threshold voltages of all memory cells belong to the highest threshold voltage distribution. If the erase operation is performed in the state in which the threshold voltages of the memory cells belong to the highest threshold voltage distribution, relevant erase cells may have a narrow threshold voltage distribution.

In the conventional pre-program, however, memory cells having high threshold voltages have higher threshold voltages because all the memory cells are programmed at the same time. Consequently, efficiency to place erase cells within a narrow threshold voltage distribution through the pre-program may be reduced.

BRIEF SUMMARY

Exemplary embodiments relate to a semiconductor memory device and a method of erasing the same, wherein, when a pre-program for an erase operation is performed, only memory cells having threshold voltages of a preset voltage or less are pre-programmed on a word line basis in order to prevent memory cells having high threshold voltages from being pre-programmed.

A semiconductor memory device according to an exemplary aspect of the present disclosure includes memory cell blocks having physical pages coupled to memory cells, peripheral circuits configured to program the memory cells or read data stored in the memory cells, and a controller configured to control the peripheral circuits so that a pre-program is performed to make memory cells in the memory cell blocks have threshold voltages higher than a set voltage by programming memory cells of the selected memory cell block, having threshold voltages lower than the set voltage, in response to an erase command. The set voltage is an intermediate threshold voltage obtained from the threshold voltages of the memory cells of the selected memory cell block.

A method of erasing a semiconductor memory device according to another exemplary aspect of the present disclosure includes performing a program verification operation in order to distinguish memory cells, having threshold voltages equal to or lower than an intermediate threshold voltage, from memory cells coupled to physical pages selected from physical pages belonging to a memory cell block selected in response to an erase command, performing a pre-program for programming the selected physical pages based on the results stored in the page buffers, repeatedly performing the verification and pre-program steps until all the threshold voltages of the memory cells coupled to the selected physical pages become the intermediate threshold voltage or higher, and performing an erase operation on the selected memory cell block.

A method of erasing a semiconductor memory device according to another exemplary aspect of the present disclosure includes performing a program verification operation on a word line of a memory block by a set voltage in response to an erase command, performing a pre-program on the word line based on a results of the program verification operation, repeatedly performing the verification and pre-program steps until all the threshold voltages of memory cells coupled to all word lines of the memory block become the set voltage or higher, and performing an erase operation on the selected memory cell block.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
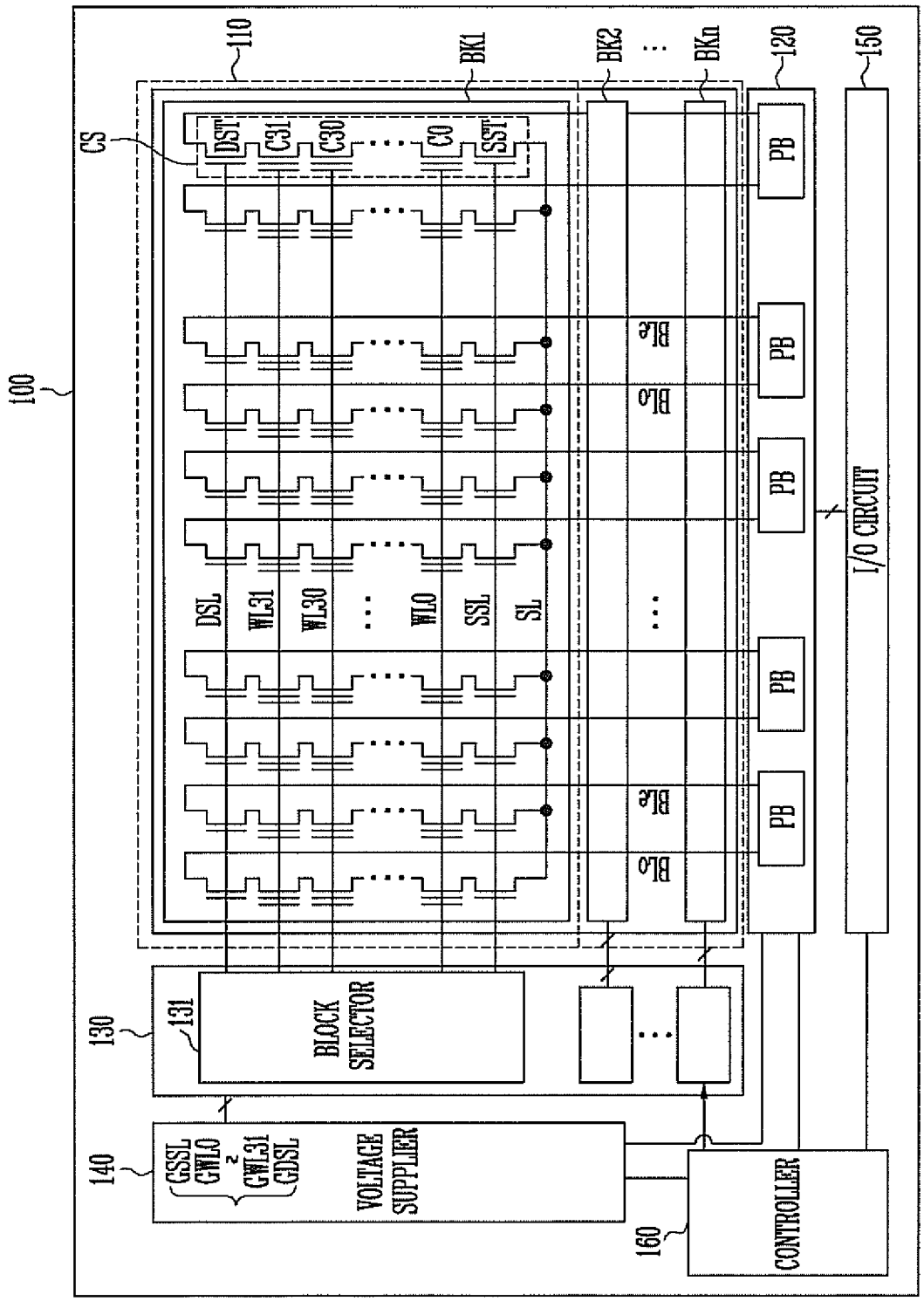
FIG. 1 a diagram of a semiconductor memory device for illustrating exemplary embodiments of the present disclosure.

FIG. 1 a diagram of a semiconductor memory device for illustrating exemplary embodiments of the present disclosure.

Referring to FIG. 1, the semiconductor memory device 100 includes a memory cell array 110, a page buffer group 120, an X decoder 130, a voltage supplier 140, an I/O circuit 150, and a controller 160.

The memory cell array 100 includes a plurality of memory cell blocks BK1 to BKn. Each of the memory cell blocks includes a plurality of cell strings CS. The memory cell blocks BK1 to BKn have a common P well.

Each of the cell strings includes $0^{th}$ to $31^{st}$ memory cells C0 to C31 coupled in series between a drain select transistor DST and a source select transistor SST.

It is assumed that the $0^{th}$ to $31^{st}$ memory cells C0 to C31 are multi-level cells MLCs having a plurality of threshold voltage distributions.

The gate of the drain select transistor DST is coupled to a drain select line DSL, and the gate of the source select transistor SST is coupled to a source select line SSL.

The gates of the $0^{th}$ to $31^{st}$ memory cells C0 to C31 are coupled to $0^{th}$ to $31^{st}$ word lines WL0 to WL31, respectively.

The drains of the drain select transistors DST are coupled to respective bit lines. The bit lines are divided into even bit lines BLe and odd bit lines BLo.

The sources of the source select transistors SST are coupled to a common source line SL.

The page buffer group 120 includes a plurality of page buffers PB operating for a program or read operation.

Each of the page buffers PB is coupled to a pair of bit lines including an even bit line BLe and an odd bit line BLo.

The I/O circuit 150 inputs and outputs external data.

The X decoder 130 includes a plurality of block selectors 131. The block selectors 131 are coupled to the respective memory cell blocks.

The block selector 131 couples the drain select line DSL, the source select line SSL, and the $0^{th}$ to $31^{st}$ word lines WL0 to WL31 of a relevant memory cell block to a global drain select line GDSL, a global source select line GSSL, and $0^{th}$ to $31^{st}$ global word lines GWL0 to GWL31 of the voltage supplier 160, respectively, in response to control signals generated by the controller 160.

The voltage supplier 140 generates operating voltages in response to the control signals of the controller 160 and provides the operating voltages to the global lines GSSL, GDSL, and GWL0 to GWL31.

The controller 160 generates control signals for controlling the operations of the page buffer group 120, the X decoder 130, the I/O circuit 150, and the voltage supplier 140 of the semiconductor memory device 100.

When a memory cell block is erased, the controller 160 controls the X decoder 130, the page buffer group 120, and the voltage supplier 140 such that memory cells having threshold voltages of a set voltage or lower are selected on the basis of each word line or plural word lines and pre-programmed.

The semiconductor memory device 100 performs a program operation on a page basis.

Each word line includes two physical pages. That is, an even page, including only the even bit lines, and an odd page, including only the odd bit lines, are included in each word line.

Furthermore, each physical page has 2, 3, or 4 logical pages according to the types of MLCs.

It is assumed that a pre-program operation according to an exemplary embodiment of this disclosure is performed on a physical-page basis.

The pre-program operation is performed to detect memory cells having specific threshold voltages or higher before an erase operation is performed.

Figure 2A:
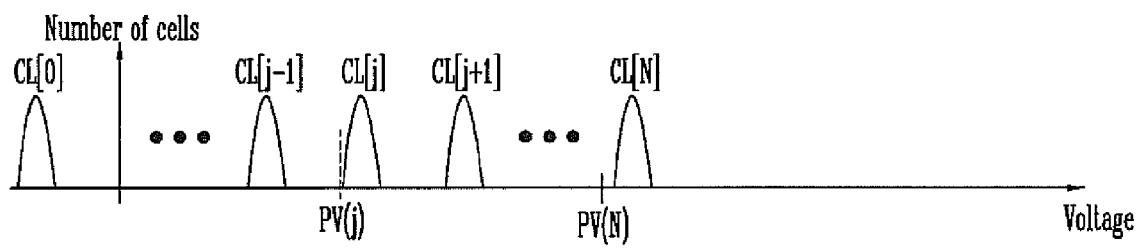
FIG. 2A is a diagram illustrating the threshold voltage distributions of memory cells.
Figure 2B:
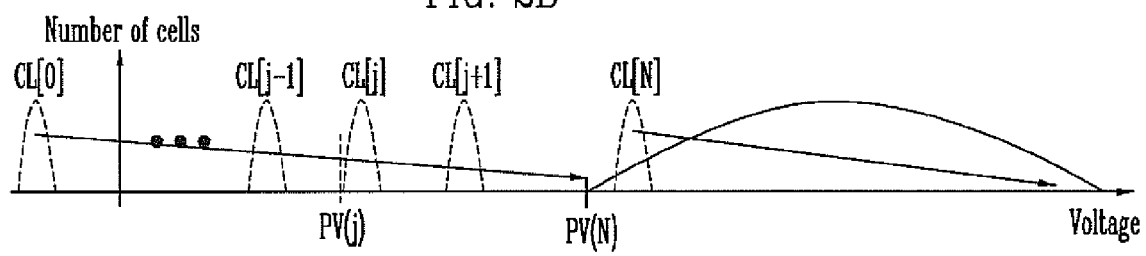
FIG. 2B is a diagram illustrating threshold voltage distribution after a known pre-program is performed.

FIG. 2A is a diagram illustrating the threshold voltage distributions of memory cells, and FIG. 2B is a diagram illustrating threshold voltage distributions after a known pre-program is performed.

FIG. 2A shows threshold voltage distributions of the memory cells before a pre-program is performed. As described above, the semiconductor memory device 100 includes the MLCs. Accordingly, as shown in FIG. 2A, the MLCs have several threshold voltage distributions CL[0] to CL[N], N being a positive integer.

In a known pre-program method, all the memory cells of each memory cell block may be programmed to have threshold voltages equal to or higher than a verification voltage PV[N], corresponding to the highest threshold voltage distribution CL[N], by supplying a program voltage to the memory cells.

FIG. 2B shows the threshold voltage distributions of the memory cells after a pre-program is performed on a memory-cell-block basis. As shown in FIG. 2B, the threshold voltages of all the memory cells shift to the verification voltage PV[N] or higher, so that the threshold voltages have a relatively wide distribution width.

If the distribution width of the threshold voltages is wide as shown in FIG. 2B, it is not narrowed even though a subsequent erase operation is performed on the memory cells.

In order to prevent this occurrence, in an exemplary embodiment of this disclosure, only memory cells having threshold voltages equal to or lower than a verification voltage PV(j), which corresponds to intermediate threshold voltage distributions CL[j−1] to CL[0], are selected and pre-programmed, j being a positive integer.

Figure 2C:
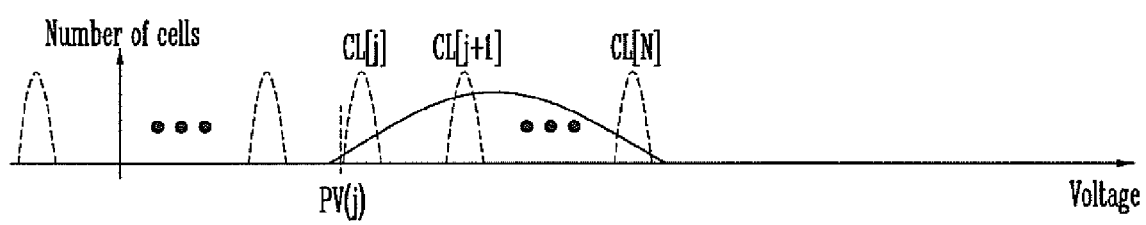
FIGS. 2C and 2D are diagrams showing shifts of the threshold voltages of memory cells after pre-programs according to first and second exemplary embodiments of this disclosure are performed.
Figure 2D:
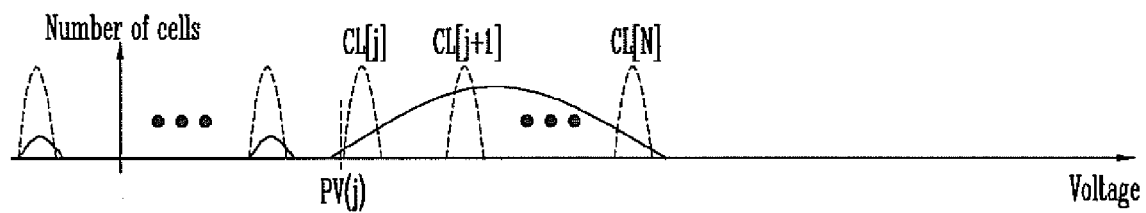

FIGS. 2C and 2D illustrate a shift of the threshold voltages of memory cells after pre-programs according to first and second exemplary embodiments of this disclosure are performed.

FIG. 2C shows threshold voltage distributions after the pre-program according to the first exemplary embodiment of this disclosure is performed.

In the first exemplary embodiment of this disclosure, a verification operation using a verification voltage PV(j) is performed on a physical-page basis, and only fail memory cells as a result of the verification operation are selected and pre-programmed. From FIG. 2C, it can be seen that a distribution of higher threshold voltages becomes narrower than that of FIG. 2B.

FIG. 2D shows threshold voltage distributions after the pre-program according to the second embodiment of this disclosure is performed.

If the pre-program is performed as in the first exemplary embodiment of this disclosure, a relatively long time may be taken because the pre-program is performed on each physical page. In order to reduce such a time, in the second exemplary embodiment of this disclosure, several physical pages are selected at once and pre-programmed. In selecting several physical pages, several word lines coupled to the even bit lines or the odd bit lines may be selected.

From FIG. 2D, it can be seen that a distribution width of higher threshold voltages is narrowed by pre-programming several physical pages at the same time.

The pre-programs according to the first and the second exemplary embodiments of this disclosure are described in detail below.

Figure 3:
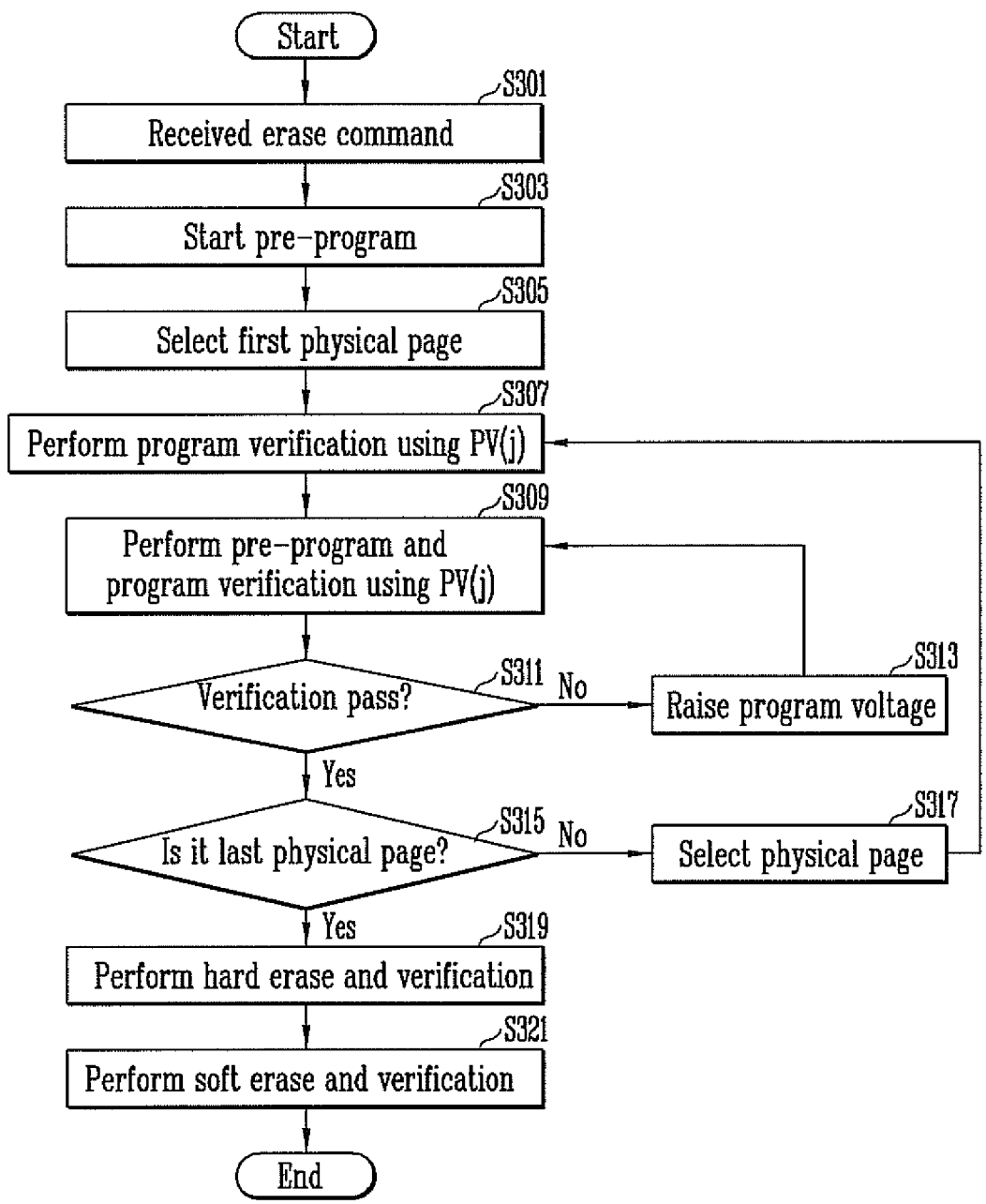
FIG. 3 is a flowchart illustrating the pre-program according to the first exemplary embodiment of this disclosure.
Figure 4:
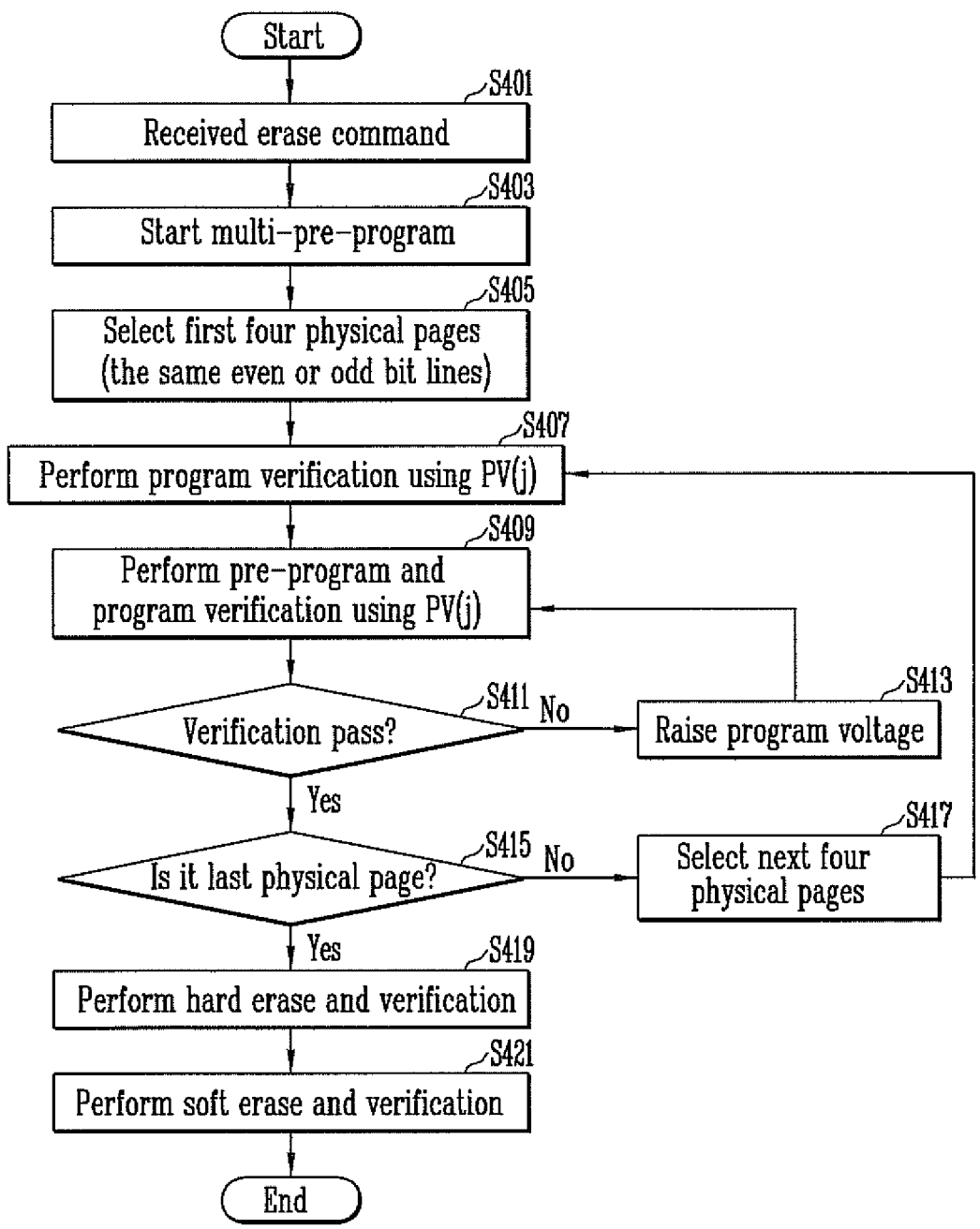
FIG. 4 is a flowchart illustrating the pre-program according to the second exemplary embodiment of this disclosure.

FIG. 3 is a flowchart illustrating the pre-program according to the first exemplary embodiment of this disclosure, and FIG. 4 is a flowchart illustrating the pre-program according to the second exemplary embodiment of this disclosure.

Figure 5A:
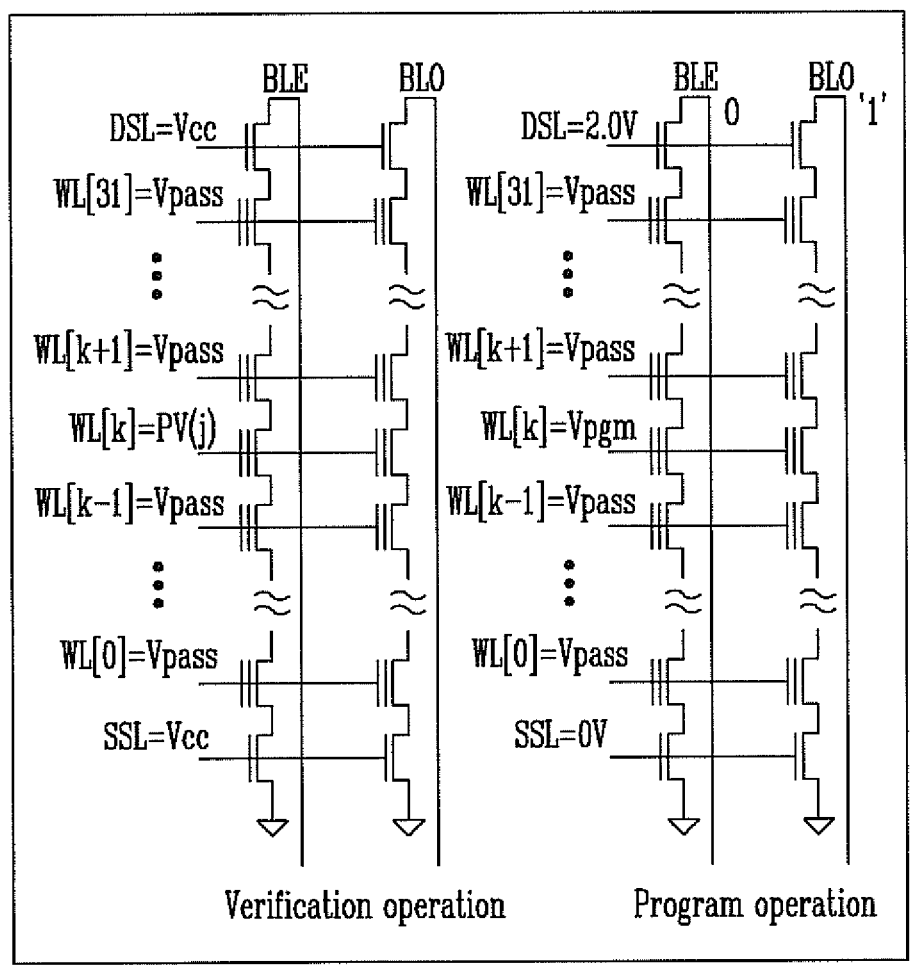
FIGS. 5A and 5B show voltages supplied to word lines in the pre-programs according to the first and the second exemplary embodiments of this disclosure.
Figure 5B:
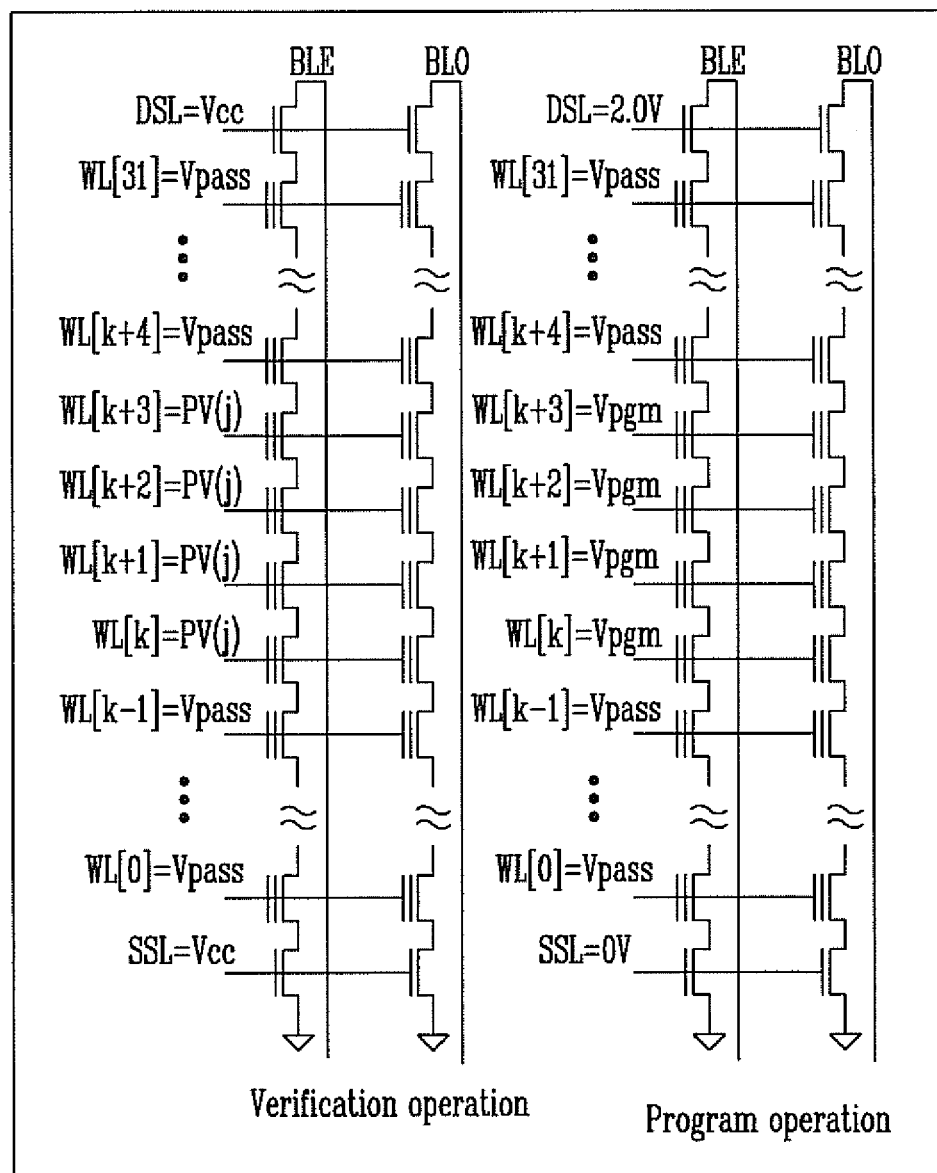

FIGS. 5A and 5B show voltages supplied to the word lines in the pre-programs according to the first and the second exemplary embodiments of this disclosure, respectively.

The flowchart of FIG. 3 is described with reference to FIG. 5A, and the flowchart of FIG. 4 is described with reference to FIG. 5B.

Referring to FIGS. 3 and 5A, when an erase command is received at step S301, the controller 160 performs a pre-program operation on a memory cell block BK selected in response to the erase command at step S303.

Next, a first physical page is selected at step S305. The first physical page, as described above, is classified according to the word lines and the even bit lines and the word lines and the odd bit lines.

For example, when the even bit lines are first selected and the first physical page is selected, the even bit lines coupled to the $0^{th}$ word line WL0 are selected.

It is checked whether the threshold voltages of memory cells coupled to the first physical page are higher than the verification voltage PV(j). This may be checked by performing a program verification operation using the verification voltage PV(j). As a result of the program verification operation, a page buffer including pass memory cells has data '1', and a page buffer including fail memory cells has data '0'.

If the threshold voltages of the memory cells are classified through the program shown in FIG. 2C, a verification voltage corresponding to an intermediate threshold voltage distribution is PV(j).

Memory cells having threshold voltages lower than the verification voltage PV(j) are determined as fail memory cells, and a page buffer including the memory cells has data '0'.

If the pre-program including the program operation and the program verification operation using the verification voltage PV(j) is repeatedly performed, only memory cells having threshold voltages lower than the verification voltage PV(j) are programmed at steps S309 to S313.

The pre-program is similar to a known program, and for the sake of convenience, a detailed description thereof is omitted.

If all the threshold voltages of the memory cells belonging to the first physical page shift to the verification voltage PV(j) or higher, a result of the program verification operation becomes a pass.

FIG. 5A shows the voltages supplied to the word lines, when the program verification operation is performed and when the program operation is performed.

Assuming that the first physical page is a $k^{th}$ word line WL[k], the program verification voltage PV(j) or a program voltage Vpgm is supplied to the $k^{th}$ word line WL[k], k being a positive integer, and a pass voltage Vpass is supplied to the remaining word lines.

If the first physical page is verified as a program pass, it is checked whether the first physical page is the last physical page of a relevant memory cell block at step S315. If, as a result of the check, the first physical page is not the last physical page, a next physical page is selected at step S317.

Since the even bit lines BLE coupled to the $0^{th}$ word line WL0 are selected at step S305, the next physical page includes the odd bit lines BLO coupled to the $0^{th}$ word line WL0.

If there is a semiconductor memory device not operating with bit lines divided into even and odd bit lines, a word line may become a physical page.

In relation to all the physical pages of the memory cell block, after only memory cells having threshold voltages equal to or lower than the verification voltage PV(j) are pre-programmed, hard erase and verification operations in a known erase loop at step S319 and soft program and verification operations at step S321 are performed.

After only the memory cells having threshold voltages equal to or lower than the verification voltage PV(j) are pre-programmed according to the above process, the memory cells have a threshold voltage distribution equal to or higher than the verification voltage PV(j), as shown in FIG. 2C. As can be seen from FIG. 2C, the threshold voltage distribution is narrower than the threshold voltage distribution of FIG. 2B according to the known pre-program.

As described above, the width of a threshold voltage distribution is narrowed after the pre-program is performed. Accordingly, even after the hard erase and verification operations and the soft program and verification operations are performed, the memory cells i.e., erase cells, may have a narrow threshold voltage distribution width of 0 V or less.

In the first exemplary embodiment, a pre-program is performed on each of all physical pages. In this case, the time for performing an erase loop, which includes the entire pre-program time, may become relatively long. In order to address this concern, a method of selecting several physical pages and performing a pre-program at the same time may be used. The method of selecting several physical pages and performing a pre-program at the same time is hereinafter called a multi-pre-program.

The second exemplary embodiment of this disclosure is described below with reference to FIGS. 4 and 5B.

Referring to FIGS. 4 and 5B, when an erase command is received at step S401, the controller 160 performs the multi-pre-program for a memory cell block at step S403.

In the multi-pre-program, several physical pages are selected and pre-programmed at the same time.

For example, if four physical pages are selected at the same time, the first to fourth physical pages are selected at step S405. Here, the physical pages selected at the same time must be the same even bit line pages or the same odd bit line pages.

That is, in order to select several physical pages at the same time, the pages included in the even or odd pages and coupled to several word lines are selected.

As shown in FIG. 5B, the $k^{th}$ word line WL[k] to the $(k+3)^{th}$ word line WL[k+3] are selected, and the even or odd pages are selected.

The controller 160 determines whether there are memory cells having threshold voltages lower than the verification voltage PV(j), in the four physical pages at step S407.

As shown in FIG. 5B, a verification operation is performed by supplying the verification voltage PV(j) to each of the $k^{th}$ word line WL[k] to the $(k+3)^{th}$ word line WL[k+3] and the pass voltage Vpass to the remaining word lines.

If, as a result of the verification operation, any one of the memory cells coupled to the $k^{th}$ word line WL[k] to the $(k+3)^{th}$ word line WL[k+3] has a threshold voltage equal to or lower than the verification voltage PV(j), the verification operation is a fail.

That is, if any one of the memory cells coupled to the $k^{th}$ word line WL[k] to the $(k+3)^{th}$ word line WL[k+3] has a threshold voltage equal to or lower than the verification voltage PV(j), memory cells coupled to the same bit line as the relevant memory cell are pre-programmed.

A program operation and a program verification operation using the verification voltage PV(j) are performed based on data stored in page buffers according to a result of the program verification operation at steps S407 to S413. When the program operation is performed, the program voltage Vpgm is supplied to only the $k^{th}$ word line WL[k] to the $(k+3)^{th}$ word line WL[k+3], as shown in FIG. 5B.

If all the threshold voltages of the memory cells coupled to the same bit line and the $k^{th}$ word line WL[k] to the $(k+3)^{th}$ word line WL[k+3] have the verification voltage PV(j) or higher, a result of the program verification operation is a pass.

The above pre-program continues up to the last physical page at step S415. If the physical page is not the last physical page, the next four physical pages are selected at step S417.

After the pre-program for all the physical pages of the memory cell block are completed, hard erase and verification operations and soft program and verification operations are performed at steps S419 and S421.

The memory cells have the threshold voltage distribution shown in FIG. 2D according to the multi-pre-program of the second exemplary embodiment of this disclosure. It can be seen that the width of the threshold voltage distribution of FIG. 2D is narrower than that of FIG. 2B according to the known program.

After an erase loop is performed according to the pre-program and the multi-pre-program of this disclosure, the threshold voltages of memory cells can be controlled to have a narrow distribution width close to 0 V.

In the semiconductor memory device and the method of erasing the same according to the exemplary embodiments of this disclosure, when a pre-program for an erase loop is performed, only memory cells having threshold voltages equal to or lower than a preset voltage are selected and pre-programmed on a word-line basis. Accordingly, efficiency of a pre-program may be improved because memory cells having high threshold voltages are not pre-programmed.

What is claimed is:

1. A semiconductor memory device, comprising:
    memory cell blocks including physical pages having a plurality of memory cells;
    peripheral circuits configured to program the plurality of memory cells or read data stored in the plurality of memory cells; and
    a controller configured to control the peripheral circuits so that a pre-program is performed to make memory cells in a selected memory cell block have threshold voltages higher than a set voltage by programming the memory cells of the selected memory cell block, having threshold voltages lower than the set voltage, in response to an erase command,
    wherein the set voltage is an intermediate threshold voltage obtained from the threshold voltages of the memory cells.

2. The semiconductor memory device of claim 1, wherein the controller is configured to control the peripheral circuits to perform the pre-program on each physical page of the selected memory cell block.

3. The semiconductor memory device of claim 1, wherein the controller is configured to control the peripheral circuits to simultaneously perform the pre-program on at least two physical pages of the selected memory cell block.

4. The semiconductor memory device of claim 1, wherein the controller is configured to control the peripheral circuit to pre-program and then erase the memory cells in the selected memory cell block.

5. A method of erasing a semiconductor memory device, comprising:
    performing a program verification operation in order to distinguish memory cells, having threshold voltages equal to or lower than an intermediate threshold voltage, from memory cells coupled to physical pages selected from physical pages belonging to a memory cell block selected in response to an erase command;
    performing a pre-program for programming the selected physical pages based on the results stored in the page buffers;
    repeatedly performing the verification and pre-program steps until all the threshold voltages of the memory cells coupled to the selected physical pages become the intermediate threshold voltage or higher; and
    performing an erase operation on the selected memory cell block.

6. The method of claim 5, further comprising selecting the intermediate threshold voltage from threshold voltages of memory cells which are changeable through a program.

7. The method of claim 5, further comprising storing a result of the program verification operations in page buffers including the memory cells having the threshold voltages equal to or lower than the intermediate threshold voltage.

8. The method of claim 5, wherein performing the erase operation comprises:
    performing hard erase and verification operations on the selected memory cell block; and
    performing soft program and verification operations on the selected memory cell block.

9. The method of claim 5, wherein the performing the program verification operation and the pre-program is performed based on a physical page.

10. The method of claim 5, wherein the performing the program verification operation and the pre-program is performed based on at least two physical pages.

11. The method of claim 10, wherein the at least two physical pages, coupled to even bit lines or odd bit lines, are selected.

12. The method of claim 10, wherein when selecting the at least two physical pages, the intermediate threshold voltage is simultaneously supplied to the at least two physical pages selected in performing the program verification operation, and a program voltage is simultaneously supplied to the at least two physical pages selected in performing the pre-program.

13. A method of erasing a semiconductor memory device, comprising:
    performing a program verification operation on a word line of a memory block by a set voltage in response to an erase command;
    performing a pre-program on the word line based on results of the program verification operation;
    repeatedly performing the verification and pre-program steps until the threshold voltages of memory cells coupled to all word lines of the memory block become the set voltage or higher; and
    performing an erase operation on the memory cell block,
    wherein the set voltage is within a range of the threshold voltages of the memory cells.

* * * * *